US010985512B1

(12) United States Patent
Huang et al.

(10) Patent No.: US 10,985,512 B1
(45) Date of Patent: Apr. 20, 2021

(54) ELECTRONIC DEVICE WITH A SOCKET FIXED IN TWO PERPENDICULAR CONNECTING AXES

(71) Applicant: QISDA CORPORATION, Taoyuan (TW)

(72) Inventors: Cheng-Chih Huang, Taoyuan (TW); Yi-Ting Lee, Kaohsiung (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/716,395

(22) Filed: Dec. 16, 2019

(30) Foreign Application Priority Data

Nov. 19, 2019 (CN) .......................... 201911133750.5

(51) Int. Cl.
*H01R 24/28* (2011.01)
*H01R 12/71* (2011.01)
(52) U.S. Cl.
CPC ............. *H01R 24/28* (2013.01); *H01R 12/71* (2013.01)
(58) Field of Classification Search
CPC ........... H01R 4/64; H01R 13/73; H01R 24/28
See application file for complete search history.

(56) References Cited

U.S. PATENT DOCUMENTS

| 6,411,526 B1* | 6/2002 | Nguyen | H01R 13/518 220/4.02 |
| 6,951,485 B2* | 10/2005 | Lin | H01R 13/6596 361/799 |
| 7,445,498 B2* | 11/2008 | Tsuo | H01R 13/748 439/562 |
| 10,658,769 B1* | 5/2020 | Shen | H01R 4/64 |
| 2008/0117569 A1* | 5/2008 | Lee | H05K 7/20145 361/678 |

FOREIGN PATENT DOCUMENTS

| CN | 203839588 U | 9/2014 |
| CN | 205122873 U | 3/2016 |

* cited by examiner

*Primary Examiner* — Abdullah A Riyami
*Assistant Examiner* — Nader J Alhawamdeh (57) ABSTRACT

An electronic device includes a socket and a casing. The socket includes a first connecting structure and a second connecting structure. The casing includes a first side wall and a second side wall, wherein the first side wall is essentially perpendicular to the second side wall. The first side wall includes a third connecting structure and the second side wall includes a fourth connecting structure. The first connecting structure is connected to the third connecting structure along a first connecting axis and the second connecting structure is connected to the fourth connecting structure along a second connecting axis, such that the socket is fixed on the casing, wherein the first connecting axis is essentially perpendicular to the second connecting axis.

11 Claims, 10 Drawing Sheets

ELECTRONIC DEVICE WITH A SOCKET FIXED IN TWO PERPENDICULAR CONNECTING AXES

BACKGROUND OF THE INVENTION

1. Field of the Invention

The invention relates to an electronic device and a socket and, more particularly, to a socket capable of enhancing fixing strength effectively and an electronic device equipped with the socket.

2. Description of the Prior Art

In general, an electronic device is equipped with a power socket. When a user uses the electronic device, the user has to plug a plug of a power cable in the power socket. When the electronic device is not used, some users may unplug the plug of the power cable from the power socket for purpose of storage or transportation. At present, the power socket is fixed on a circuit board. After plugging/unplugging the plug of the power cable in/from the power socket many times, the pins of the power socket connected to the circuit board may come off the circuit board easily, such that a short circuit or fire may occur.

SUMMARY OF THE INVENTION

An objective of the invention is to provide a socket capable of enhancing fixing strength effectively and an electronic device equipped with the socket, so as to solve the aforesaid problems.

According to an embodiment of the invention, an electronic device comprises a socket and a casing. The socket comprises a first connecting structure and a second connecting structure. The casing comprises a first side wall and a second side wall, wherein the first side wall is essentially perpendicular to the second side wall. The first side wall comprises a third connecting structure and the second side wall comprises a fourth connecting structure. The first connecting structure is connected to the third connecting structure along a first connecting axis and the second connecting structure is connected to the fourth connecting structure along a second connecting axis, such that the socket is fixed on the casing, wherein the first connecting axis is essentially perpendicular to the second connecting axis.

According to another embodiment of the invention, a socket comprises a first connecting structure and a second connecting structure. The first connecting structure defines a first connecting axis and the second connecting structure defines a second connecting axis, wherein the first connecting axis is essentially perpendicular to the second connecting axis.

As mentioned in the above, since the socket of the invention is fixed on the casing of the electronic device along two connecting axes essentially perpendicular to each other, the invention can enhance fixing strength for the socket in any direction effectively. When a user plugs/unplugs a plug in/from the socket in any direction, the socket will not come off the casing easily. Furthermore, the socket of the invention is not fixed on a circuit board. Therefore, even if the socket comes off the casing, a short circuit or fire will not occur.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
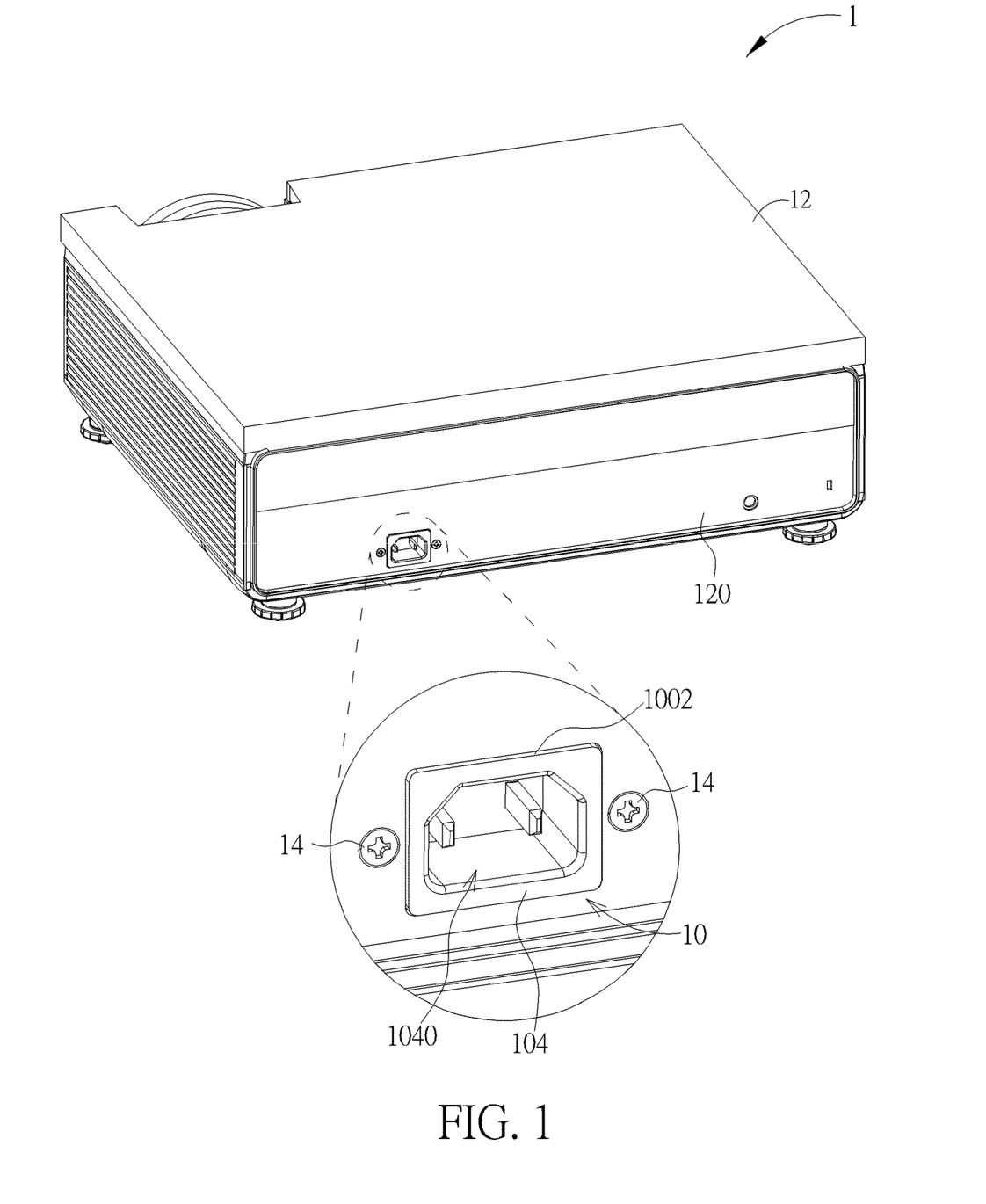
FIG. 1 is a perspective view illustrating an electronic device according to an embodiment of the invention.
Figure 2:
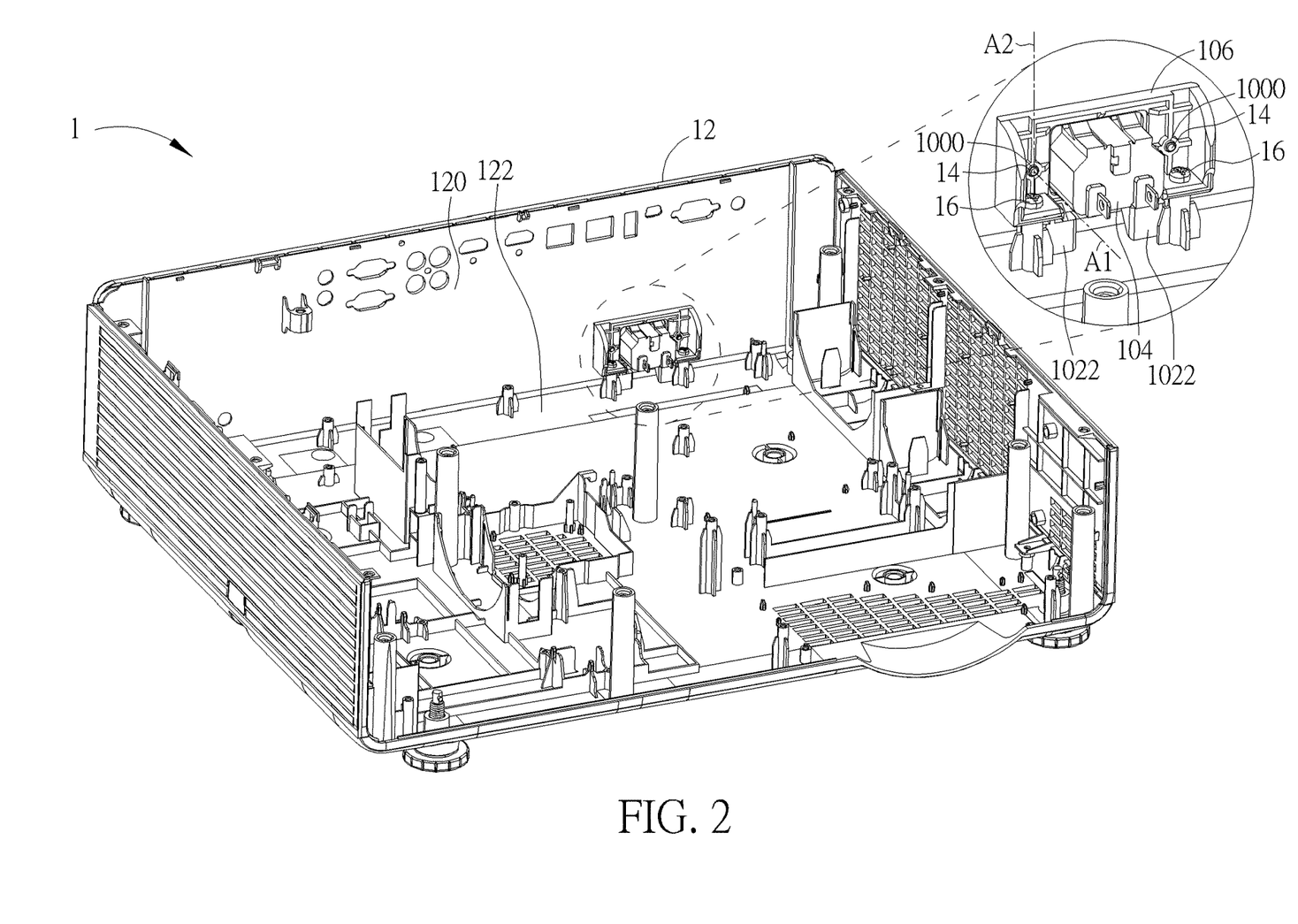
FIG. 2 is an inside view illustrating parts of the electronic device shown in FIG. 1 from another viewing angle.
Figure 3:
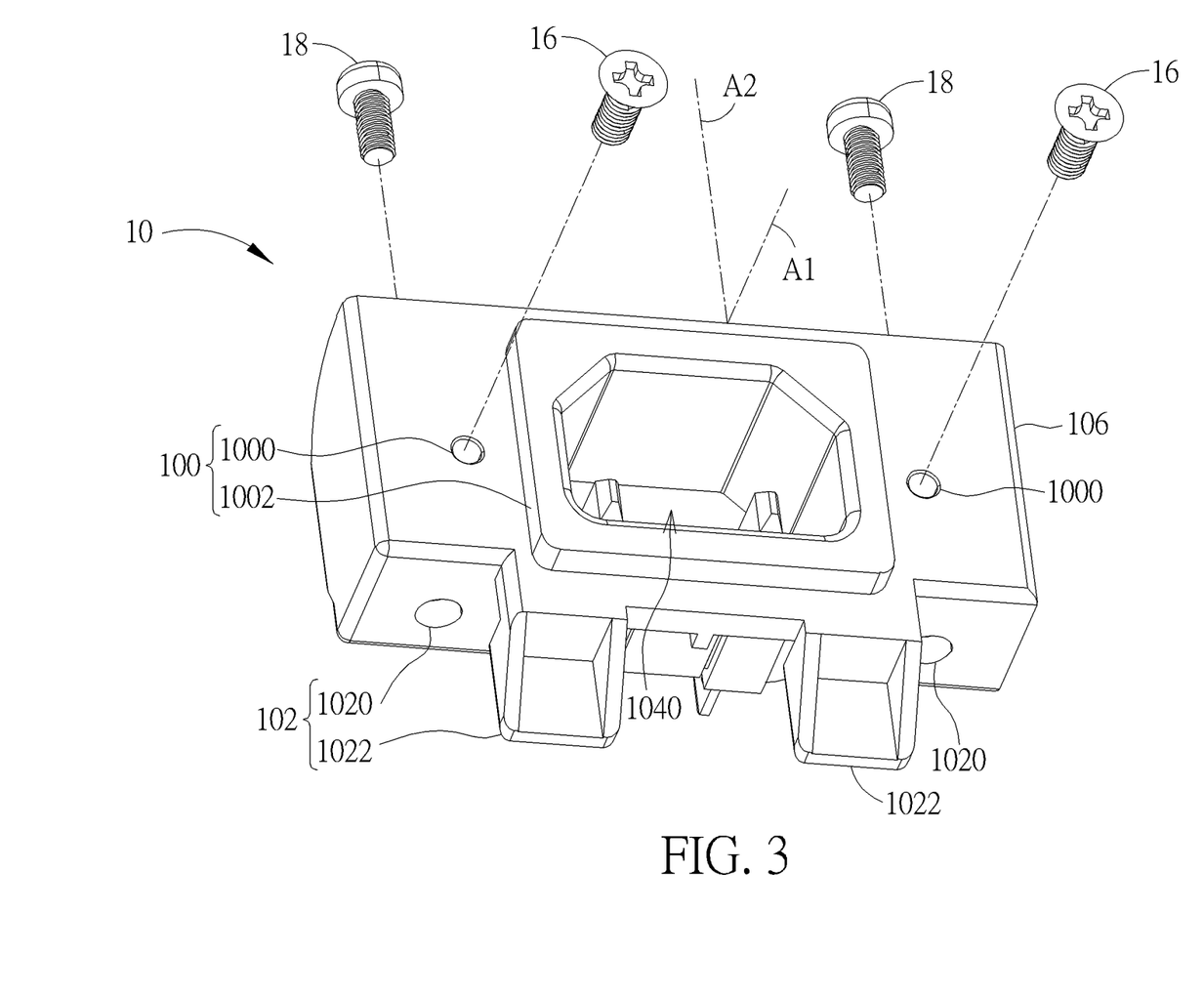
FIG. 3 is a perspective view illustrating the socket shown in FIG. 1.
Figure 4:
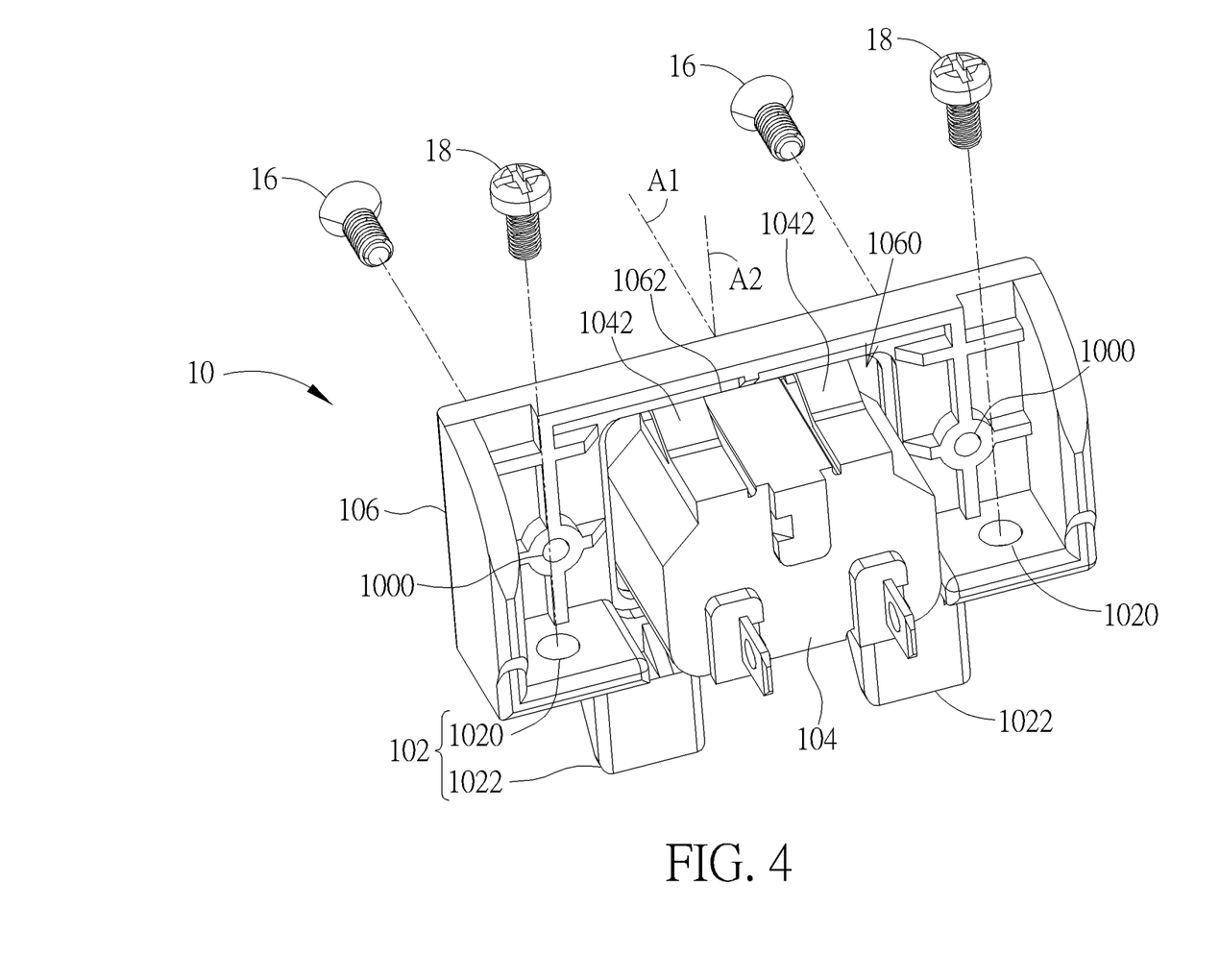
FIG. 4 is a perspective view illustrating the socket shown in FIG. 3 from another viewing angle.
Figure 5:
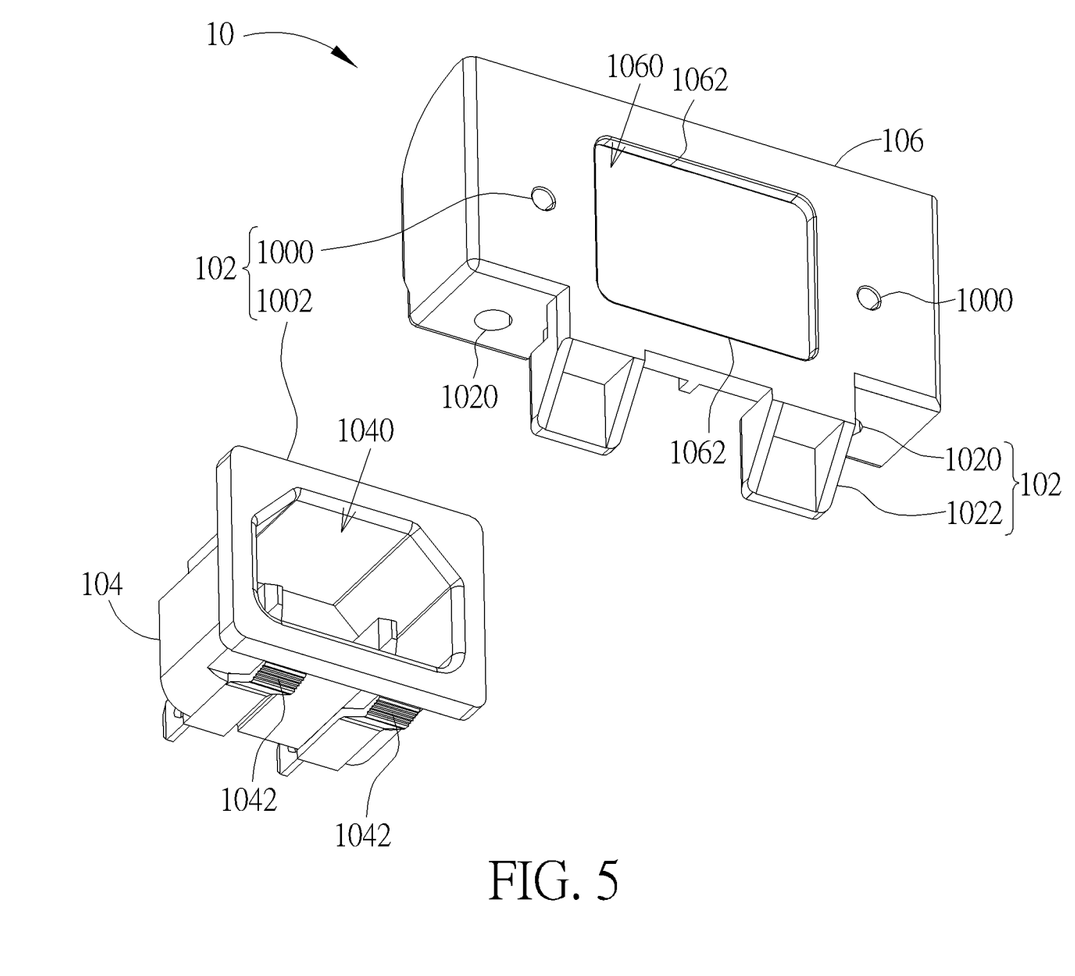
FIG. 5 is an exploded view illustrating the socket shown in FIG. 3.
Figure 6:
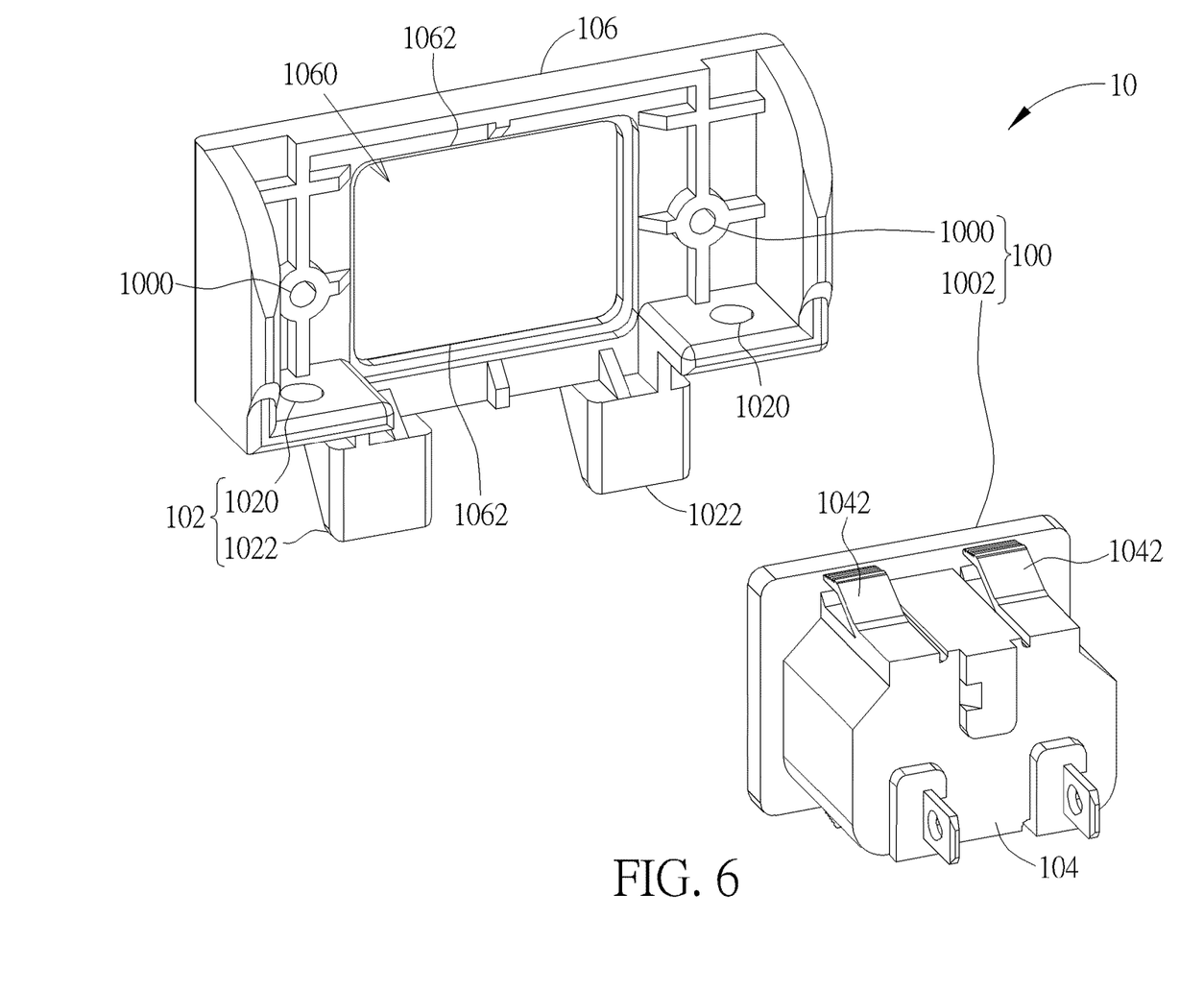
FIG. 6 is an exploded view illustrating the socket shown in FIG. 3 from another viewing angle.
Figure 7:
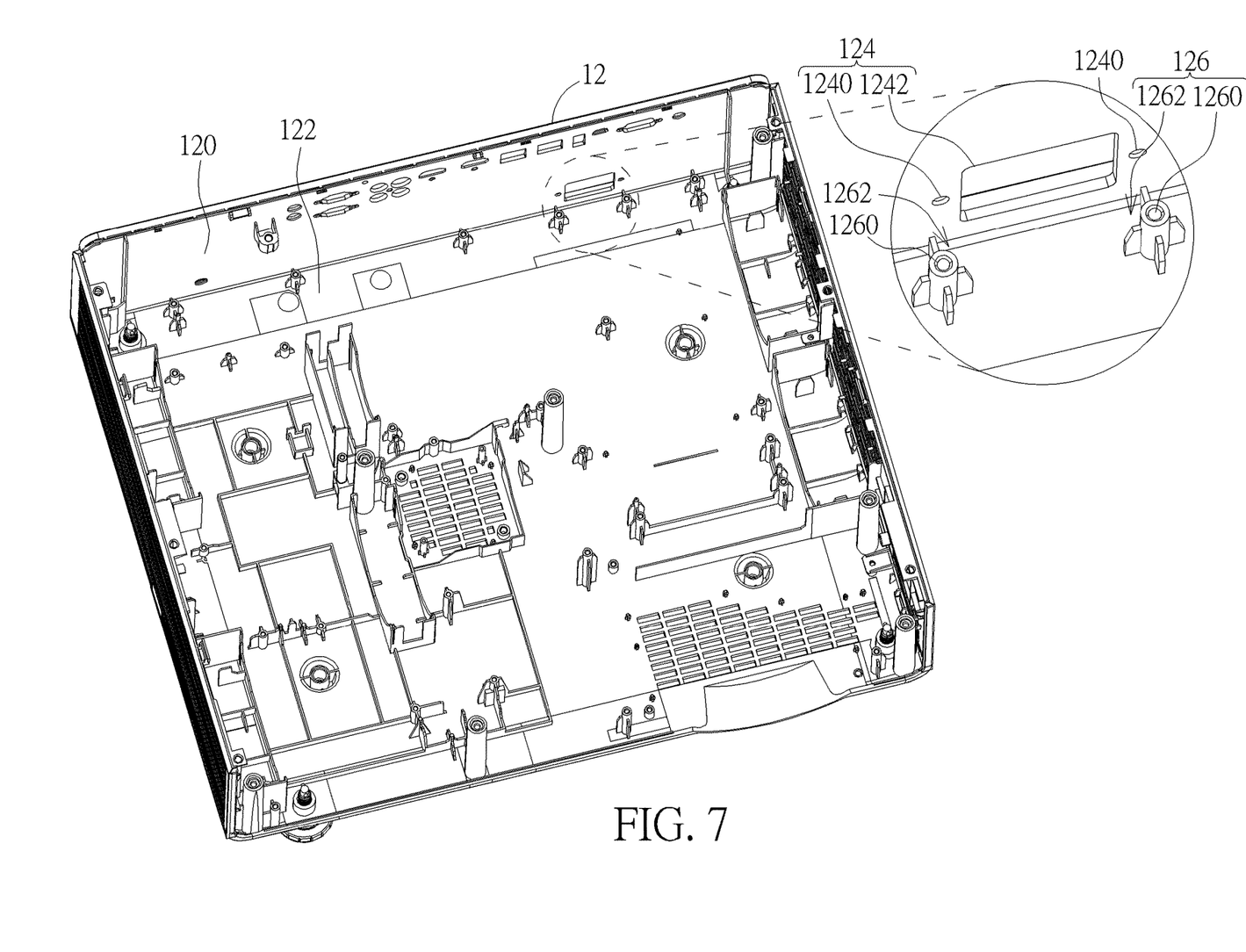
FIG. 7 is a perspective view illustrating the casing shown in FIG. 2.

Referring to FIGS. 1 to 7, FIG. 1 is a perspective view illustrating an electronic device 1 according to an embodiment of the invention, FIG. 2 is an inside view illustrating parts of the electronic device 1 shown in FIG. 1 from another viewing angle, FIG. 3 is a perspective view illustrating the socket 10 shown in FIG. 1, FIG. 4 is a perspective view illustrating the socket 10 shown in FIG. 3 from another viewing angle, FIG. 5 is an exploded view illustrating the socket 10 shown in FIG. 3, FIG. 6 is an exploded view illustrating the socket 10 shown in FIG. 3 from another viewing angle, and FIG. 7 is a perspective view illustrating the casing 12 shown in FIG. 2.

As shown in FIGS. 1 and 2, the electronic device 1 comprises a socket 10 and a casing 12. In this embodiment, the electronic device 1 may be, but not limited to, a projector and the socket 10 may be, but not limited to, a power socket. In general, the electronic device 1 may be further equipped with some necessary hardware or software components for specific purposes, such as a circuit board, a memory, an input/output port, applications, a power supply, a communication module, etc., and it depends on practical applications.

As shown in FIGS. 3 to 6, the socket 10 comprises a first connecting structure 100 and a second connecting structure 102. The first connecting structure 100 defines a first connecting axis A1 and the second connecting structure 102 defines a second connecting axis A2, wherein the first connecting axis A1 is essentially perpendicular to the second connecting axis A2. The socket 10 is fixed on the casing 12 along the first connecting axis A1 and the second connecting axis A2. It should be noted that when an angle included between the first connecting axis A1 and the second connecting axis A2 is slightly larger than or slightly smaller than 90 degrees due to manufacturing tolerance, the angle still conform to the aforesaid definition of "essentially perpendicular".

In this embodiment, the first connecting structure 100 may comprise two first fixing holes 1000 and a first protruding portion 1002, and the second connecting structure 102 may comprise two second fixing holes 1020 and two second protruding portions 1022. It should be noted that the number and position of the first fixing holes 1000, the second fixing holes 1020 and the second protruding portions 1022 may be determined according to practical applications, so the invention is not limited to the embodiment shown in the figures.

In this embodiment, the socket 10 may comprise a main body 104 and a frame 106, wherein the frame 106 is detachably disposed on the main body 104. At this time, the first protruding portion 1002 may be located on the main body 104, and the first fixing holes 1000, the second fixing holes 1020 and the second protruding portions 1022 may be located on the frame 106. The main body 104 may comprise a port 1040 and four first positioning portions 1042, wherein the four first positioning portions 1042 may be arranged at opposite sides of the main body 104 symmetrically. The port 1040 is configured to connect a plug (not shown), wherein the first protruding portion 1002 surrounds the port 1040. In this embodiment, the first positioning portion 1042 may be, but not limited to, an elastic arm. The frame 106 may comprise an opening 1060 and two positioning portions 1062, wherein the two positioning portions 1062 may be located at opposite sides of the opening 1060 and correspond to the four first positioning portions 1042 of the main body 104.

To assemble the main body 104 and the frame 106, a back end of the main body 104 may be inserted into the opening 1060 of the frame 106. At this time, the first positioning portions 1042 are pushed by the second positioning portions 1062 to deform elastically. Then, the first positioning portions 1042 engage with the second positioning portions 1062. Accordingly, the first positioning portions 1042 cooperate with the second positioning portions 1062 to position the frame 106 on the main body 104. In this embodiment, a sawtooth-shaped structure may be formed on an end of the first positioning portion 1042, so as to enhance the strength of engagement between the first positioning portions 1042 and the second positioning portions 1062. It should be noted that the number and position of the first positioning portions 1042 and the second positioning portions 1062 may be determined according to practical applications, so the invention is not limited to the embodiment shown in the figures. Furthermore, the main body 104 and the frame 106 may also be connected to each other by other manners (e.g. adhesion, rivet, weld, screw, etc.) according to practical applications.

As shown in FIGS. 2 and 7, the casing 12 comprise a first side wall 120 and a second side wall 122, wherein the first side wall 120 is essentially perpendicular to the second side wall 122. In this embodiment, the second side wall 122 may be, but not limited to, a bottom of the casing 12. It should be noted that when an angle included between the first side wall 120 and the second side wall 122 is slightly larger than or slightly smaller than 90 degrees due to manufacturing tolerance and appearance design, the angle still conform to the aforesaid definition of "essentially perpendicular". The first side wall 120 comprises a third connecting structure 124 and the second side wall 122 comprises a fourth connecting structure 126. In this embodiment, the third connecting structure 124 may comprise two third fixing holes 1240 and a through hole 1242, and the fourth connecting structure 126 may comprise two fourth fixing holes 1260 and two recesses 1262, wherein the third fixing holes 1240 correspond to the first fixing holes 1000, the through hole 1242 corresponds to the first protruding portion 1002, the fourth fixing holes 1260 correspond to the second fixing holes 1020, and the recesses 1262 correspond to the second protruding portions 1022. It should be noted that the number and position of the third fixing holes 1240, the fourth fixing holes 1260 and the recesses 1262 may be determined according to practical applications, so the invention is not limited to the embodiment shown in the figures.

To assemble the socket 10 and the casing 12, the first connecting structure 100 is connected to the third connecting structure 124 along the first connecting axis A1 and the second connecting structure 102 is connected to the fourth connecting structure 126 along the second connecting axis A2, such that the socket 10 is fixed on the casing 12. In this embodiment, the electronic device 1 may further comprise two first fixing members 14 and two second fixing members 16. It should be noted that the number of the first fixing members 14 and the second fixing members 16 may be determined according to the number of the first fixing holes 1000, the second fixing holes 1020, the third fixing holes 1240 and the fourth fixing holes 1260, so the invention is not limited to the embodiment shown in the figures.

For further illustration, the first protruding portion 1002 of the socket 10 may be embedded into the through hole 1242 of the casing 12 along the first connecting axis A1 and the second protruding portions 1022 of the socket 10 may be embedded into the recesses 1262 of the casing 12 along the second connecting axis A2, such that the socket 10 is fixed on the casing 12. At this time, the first fixing holes 1000 and the second fixing holes 1020 of the socket 10 are aligned with the third fixing holes 1240 and the fourth fixing holes 1260 of the casing 12, respectively. Then, the first fixing members 14 may be inserted into the first fixing holes 1000 and the third fixing holes 1240 along the first connecting axis A1 and the second fixing members 16 may be inserted into the second fixing holes 1020 and the fourth fixing holes 1260 along the second connecting axis A2, such that the socket 10 may be fixed on the casing 12 more stably. In this embodiment, the first fixing member 14 and the second fixing member 16 may be screws, and the first fixing hole 1000 and the fourth fixing hole 1260 may be screw holes, such that the first fixing member 14 may be screwed into the first fixing hole 1000 and the second fixing member 16 may be screwed into the fourth fixing hole 1260.

Since the socket 10 is fixed on the casing 12 of the electronic device 1 along the first connecting axis A1 and the second connecting axis A2 essentially perpendicular to each other, the invention can enhance fixing strength for the socket 10 in any direction effectively. When a user plugs/unplugs a plug in/from the socket 10 in any direction, the socket 10 will not come off the casing 12 easily. Furthermore, the socket 10 of the invention is not fixed on a circuit board. Therefore, even if the socket 10 comes off the casing 12, a short circuit or fire will not occur.

As shown in FIG. 1, when the first protruding portion 1002 of the socket 10 is embedded into the through hole 1242 of the casing 12, the first protruding portion 1002 may protrude from an outer surface of the first side wall 120, such that the first protruding portion 1002 may be engaged in the through hole 1242 stably. In another embodiment, when the first protruding portion 1002 of the socket 10 is embedded into the through hole 1242 of the casing 12, the first protruding portion 1002 may be flush with the outer surface of the first side wall 120, such that the first protruding portion 1002 may be engaged in the through hole 1242 stably.

In another embodiment, the second protruding portions 1022 and the recesses 1262 may also be exchanged with each other. That is to say, the fourth connecting structure 126 of the casing 12 may comprise the second protruding portions 1022 and the second connecting structure 102 of the socket 10 may comprise the recesses 1262. In other words, according to practical applications, one of the second connecting structure 102 and the fourth connecting structure 126 may comprise the second protruding portions 1022, and another one of the second connecting structure 102 and the fourth connecting structure 126 may comprise the recesses 1262.

In another embodiment, the first connecting structure 100 of the socket 10 may only comprise the first fixing holes 1000, the second connecting structure 102 of the socket 10 may only comprise the second fixing holes 1020, the third connecting structure 124 of the casing 12 may only comprise the third fixing holes 1240, and the fourth connecting structure 126 of the casing 12 may only comprise the fourth fixing holes 1260. That is to say, the socket 10 may be fixed on the casing 12 only by the first fixing holes 1000, the second fixing holes 1020, the third fixing holes 1240, the fourth fixing holes 1260, the first fixing members 14 and the second fixing members 16.

In another embodiment, the first connecting structure 100 of the socket 10 may only comprise the first protruding portion 1002, the second connecting structure 102 of the socket 10 may only comprise the second protruding portions 1022, the third connecting structure 124 of the casing 12 may only comprise the through hole 1242, and the fourth connecting structure 126 of the casing 12 may only comprise the recesses 1262. That is to say, the socket 10 may be fixed on the casing 12 only by the first protruding portion 1002, the second protruding portions 1022, the third fixing holes 1240, the fourth fixing holes 1260, the through hole 1242 and the recesses 1262.

When the first connecting structure 100 comprises the first fixing holes 1000 and the first protruding portion 1002 simultaneously, the first connecting structure 100 is located on the main body 104 and the frame 106 of the socket 10. When the first connecting structure 100 only comprises the first fixing holes 1000, the first connecting structure 100 is located on the frame 106 of the socket 10. When the first connecting structure 100 only comprises the first protruding portion 1002, the first connecting structure 100 is located on the main body 104 of the socket 10. Thus, according to different embodiments of the first connecting structure 100, the first connecting structure 100 may be selectively located on at least one of the main body 104 and the frame 106 of the socket 10. Furthermore, no matter whether the second connecting structure 102 comprises the second fixing holes 1020 and the second protruding portion 1022 simultaneously, the second connecting structure 102 is located on the frame 106.

Figure 8:
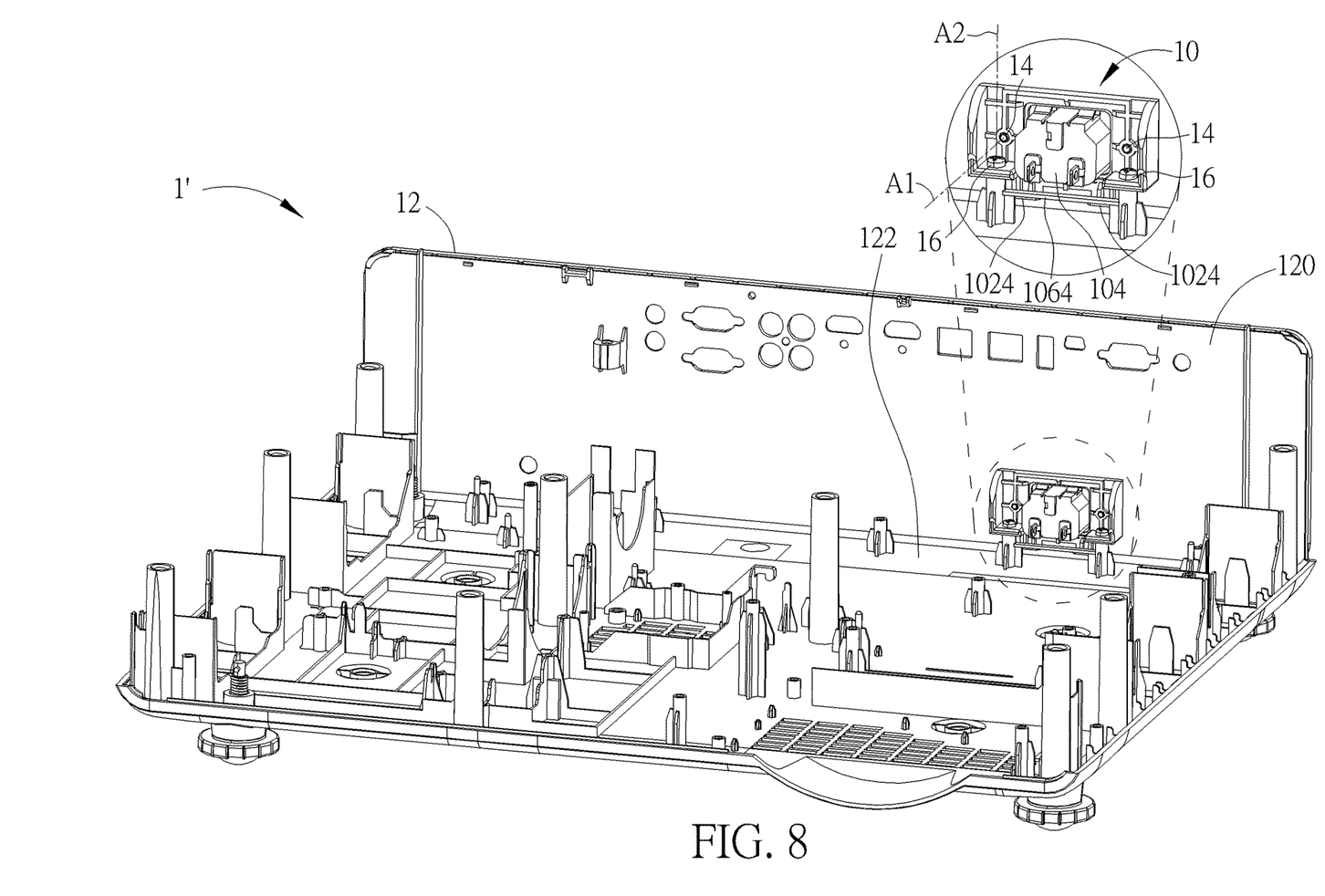
FIG. 8 is an inside view illustrating parts of an electronic device according to another embodiment of the invention.
Figure 9:
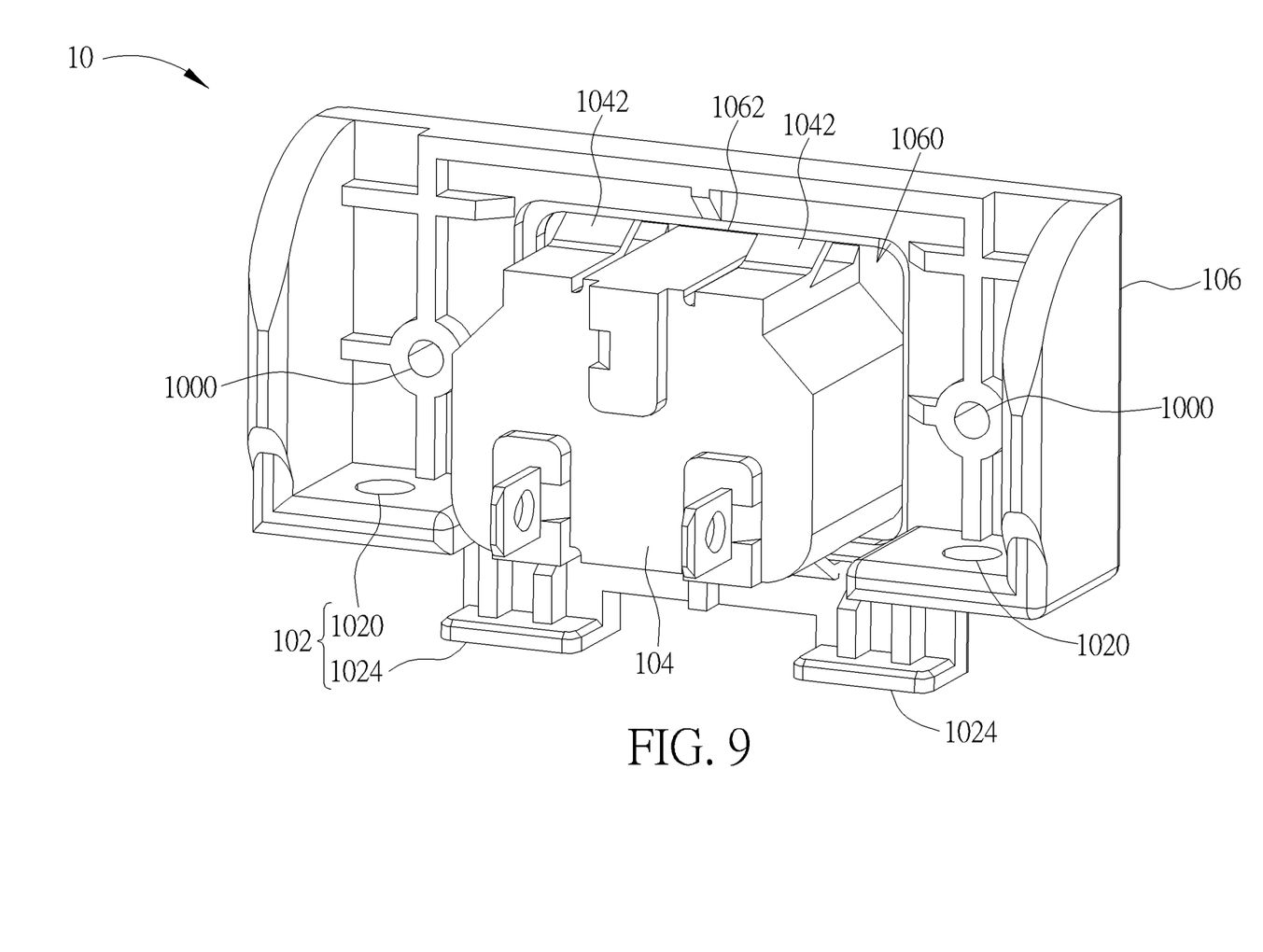
FIG. 9 is a perspective view illustrating the socket shown in FIG. 8.
Figure 10:
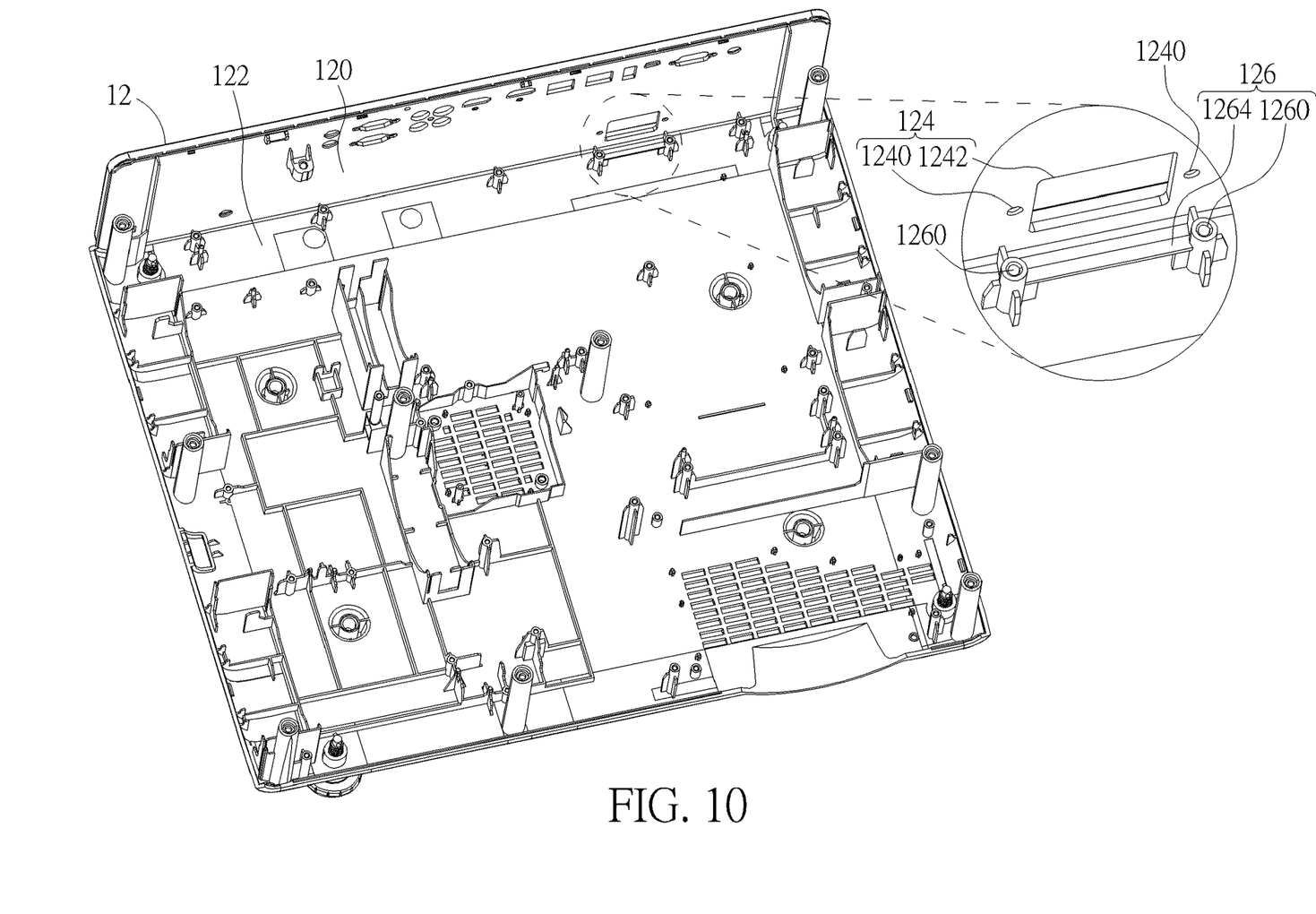
FIG. 10 is a perspective view illustrating the casing shown in FIG. 8.

Referring to FIGS. 8 to 10, FIG. 8 is an inside view illustrating parts of an electronic device 1' according to another embodiment of the invention, FIG. 9 is a perspective view illustrating the socket 10 shown in FIG. 8, and FIG. 10 is a perspective view illustrating the casing 12 shown in FIG. 8. The main difference between the electronic device 1' and the aforesaid electronic device 1 is that the second connecting structure 102 of the socket 10 of the electronic device 1' further comprises two engaging hooks 1024 and the fourth connecting structure 126 of the casing 12 of the electronic device 1' further comprises a restraining portion 1264, as shown in FIGS. 8 to 10. It should be noted that the same elements in FIGS. 8-10 and FIGS. 1-7 are represented by the same numerals, so the repeated explanation will not be depicted herein again. Therefore, only the engaging hooks 1024 and the restraining portion 1264 are depicted in the following for further illustration.

In this embodiment, when the socket 10 is assembled to the casing 12, the engaging hooks 1024 of the socket 10 engage with the restraining portion 1264 of the casing 12 along the second connecting axis A2, such that the socket 10 is fixed on the casing 12. In other words, the invention may replace the second protruding portions 1022 and the recesses 1262 mentioned in the above by the engaging hooks 1024 and the restraining portion 1264. It should be noted that the number and position of the engaging hooks 1024 may be determined according to practical applications, so the invention is not limited to the embodiment shown in the figures.

In another embodiment, the engaging hooks 1024 may extend from the aforesaid second protruding portions 1022 and the restraining portion 1264 may be disposed at one side of the aforesaid recesses 1262. In other words, the invention may also integrate the engaging hooks 1024 and the restraining portion 1264 with the second protruding portions 1022 and the recesses 1262 mentioned in the above, so as to enhance fixing strength between the socket 10 and the casing 12.

In another embodiment, the engaging hooks 1024 and the restraining portion 1264 may also be exchanged with each other. That is to say, the fourth connecting structure 126 of the casing 12 may comprise the engaging hooks 1024 and the second connecting structure 102 of the socket 10 may comprise the restraining portion 1264. In other words, according to practical applications, one of the second connecting structure 102 and the fourth connecting structure 126 may comprise the engaging hooks 1024, and another one of the second connecting structure 102 and the fourth connecting structure 126 may comprise the restraining portion 1264.

As mentioned in the above, since the socket of the invention is fixed on the casing of the electronic device along two connecting axes essentially perpendicular to each other, the invention can enhance fixing strength for the socket in any direction effectively. When a user plugs/unplugs a plug in/from the socket in any direction, the socket will not come off the casing easily. Furthermore, the socket of the invention is not fixed on a circuit board. Therefore, even if the socket comes off the casing, a short circuit or fire will not occur.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An electronic device comprising:
   a socket comprising a first connecting structure and a second connecting structure; and
   a casing comprising a first side wall and a second side wall, the first side wall being essentially perpendicular to the second side wall, the first side wall comprising a third connecting structure, the second side wall comprising a fourth connecting structure;
   wherein the first connecting structure is connected to the third connecting structure along a first connecting axis and the second connecting structure is connected to the fourth connecting structure along a second connecting axis, such that the socket is fixed on the casing, the first connecting axis is essentially perpendicular to the second connecting axis.

2. The electronic device of claim 1, further comprising a first fixing member, the first connecting structure comprising a first fixing hole, the third connecting structure comprising a third fixing hole, the first fixing member being inserted into the first fixing hole and the third fixing hole along the first connecting axis.

3. The electronic device of claim 1, further comprising a second fixing member, the second connecting structure comprising a second fixing hole, the fourth connecting structure comprising a fourth fixing hole, the second fixing member being inserted into the second fixing hole and the fourth fixing hole along the second connecting axis.

4. The electronic device of claim 1, wherein the first connecting structure comprises a first protruding portion, the third connecting structure comprises an opening, and the first protruding portion is embedded into the opening along the first connecting axis.

5. The electronic device of claim 4, wherein when the first protruding portion is embedded into the opening, the first protruding portion is flush with an outer surface of the first side wall or the first protruding portion protrudes from the outer surface of the first side wall.

6. The electronic device of claim 1, wherein one of the second connecting structure and the fourth connecting structure comprises a second protruding portion, another one of the second connecting structure and the fourth connecting structure comprises a recess, and the second protruding portion is embedded into the recess along the second connecting axis.

7. The electronic device of claim 1, wherein one of the second connecting structure and the fourth connecting structure comprises an engaging hook, another one of the second connecting structure and the fourth connecting structure comprises a restraining portion, and the engaging hook engages with the restraining portion along the second connecting axis.

8. The electronic device of claim 1, wherein the socket comprises a main body and a frame, the frame is disposed on the main body, the first connecting structure is selectively located on at least one of the main body and the frame, and the second connecting structure is located on the frame.

9. The electronic device of claim 8, wherein the main body comprises a first positioning portion, the frame comprises a second positioning portion, and the first positioning portion cooperates with the second positioning portion to position the frame on the main body.

10. The electronic device socket of claim 1, wherein the first connecting structure comprises at least one of a first fixing hole and a first protruding portion.

11. The electronic device socket of claim 1, wherein the second connecting structure comprises at least one of a second fixing hole, a second protruding portion and an engaging hook.

* * * * *